(12) United States Patent
Ortenzi et al.

(10) Patent No.: US 10,251,311 B2
(45) Date of Patent: Apr. 2, 2019

(54) SPLIT COIL COOLER FOR AN ELECTRONIC RACK

(71) Applicant: Scalematrix, San Diego, CA (US)

(72) Inventors: Mark David Ortenzi, Escondido, CA (US); Chris Orlando, Escondido, CA (US)

(*) Notice: Subject to any disclaimer, the term of this patent is extended or adjusted under 35 U.S.C. 154(b) by 0 days.

(21) Appl. No.: 15/944,450

(22) Filed: Apr. 3, 2018

(65) Prior Publication Data

US 2018/0295749 A1  Oct. 11, 2018

Related U.S. Application Data

(60) Provisional application No. 62/481,600, filed on Apr. 4, 2017.

(51) Int. Cl.
*H05K 7/20* (2006.01)

(52) U.S. Cl.
CPC ..... *H05K 7/20609* (2013.01); *H05K 7/20572* (2013.01); *H05K 7/20718* (2013.01); *H05K 7/20754* (2013.01); *H05K 7/20136* (2013.01)

(58) Field of Classification Search
CPC ........ F24F 11/30; F24F 2110/10; F24F 11/46; F24F 11/62; F24F 11/58; F24F 11/52; F24F 13/20; F24F 11/63; F24F 11/56; F24F 13/10; F24F 13/30; F24F 2110/20; F24F 11/65; F24F 13/222; F24F 1/0011; F24F 2120/10; F24F 2120/12; F24F 11/32; F24F 11/54; F24F 11/77; F24F 11/79; F24F 11/89; F24F 13/28; F24F 1/00; F24F 1/0022; F24F 1/0033; F24F 2001/0037; F24F 2013/227; F24F 2110/00; F24F 2140/50; F24F 2221/54; F24F 3/1405; F24F 5/0046; F24F 11/0008; F24F 11/41; F24F 11/523; F24F 11/64; F24F 11/70; F24F 13/082; F24F 1/0007; F24F 1/0059; F24F 1/02; F24F 1/027; F24F 2003/1446; F24F 2013/205; F24F 2013/207; F24F 2110/12; F24F 2130/10; F24F 2140/40; F24F 2140/60; F24F 2221/26; F24F 11/0001; F24F 11/33; F24F 11/34; F24F 11/36; F24F 11/38; F24F 11/43; F24F 11/47; F24F 11/49; F24F 11/50; F24F 11/61; F24F 11/72; F24F 11/74; F24F 11/745; F24F 11/75; F24F 11/80; F24F 11/81; F24F 11/83; F24F 11/85; F24F 11/86;
(Continued)

(56) References Cited

U.S. PATENT DOCUMENTS 9,057,553 B1 * 6/2015 Metzger ............... F25D 17/06

* cited by examiner

*Primary Examiner* — Mandeep S Buttar
(74) *Attorney, Agent, or Firm* — Law Office of Scott C Harris, Inc

(57) ABSTRACT

A cooling system for cooling air in a rack mounted equipment such as computer systems. The cooling system includes a split and staggered cooling system where the cooling is carried out by two different parallel coolers. One of the coolers is pressed against the walls of the cooling duct, but allows some amount of the air to pass around the cooler. The output of that first cooler is also constricted to a similar amount as the air output that passes around the first cooler. The second cooler is downstream of the first cooler, and receives all the air that passes around the first cooler and provides cooling to that air. In this way, two different split coolers can be used to cool the air stream.

11 Claims, 6 Drawing Sheets

(58) Field of Classification Search
CPC .. F24F 11/88; F24F 13/02; F24F 13/08; F24F 13/14; F24F 13/15; F24F 13/22; F24F 13/24; F24F 1/0003; F24F 1/0014; F24F 1/0025; F24F 1/025; F24F 1/04; F24F 1/36; F24F 2001/004; F24F 2001/0048; F24F 2001/0088; F24F 2001/0092; F24F 2001/0096; F24F 2003/1614; F24F 2011/0006; F24F 2013/088; F24F 2013/202; F24F 2013/221; F24F 2013/228; F24F 2110/22; F24F 2110/40; F24F 2110/50; F24F 2110/65; F24F 2110/70; F24F 2110/72; F24F 2120/14; F24F 2130/00; F24F 2130/30; F24F 2140/12; F24F 2140/30; F24F 2203/021; F24F 2221/20; F24F 2221/28; F24F 2221/34; F24F 2221/36; F24F 2221/38; F24F 3/044; F24F 3/14; F24F 3/16; F24F 3/1603; F24F 5/00; F24F 5/0035; F24F 6/12; F24F 7/08; F24F 2203/1016; F24F 2001/0085; F24F 2012/007; F24F 12/001; F24F 2001/0066; F24F 5/0003; H01L 33/648; F28D 15/0233; F28D 1/0477; F28D 15/0266; F28D 1/0233; F28D 1/024; F28D 1/0452; F28D 1/0461; F28F 17/005; F28F 13/08; F28F 2265/06; F25B 39/00; F25B 40/02; F25B 2339/041; F25B 2339/047; H05K 7/20827; H05K 7/20136; H05K 7/20572; H05K 7/20609; H05K 7/20718

USPC .............. 361/696, 679.47; 165/80.3, 104.33; 62/288, 291

See application file for complete search history.

SPLIT COIL COOLER FOR AN ELECTRONIC RACK

This application claims the benefit of provisional application No. 62/481,600, filed Apr. 4, 2017, the entire contents of which are herewith incorporated by reference.

BACKGROUND OF THE INVENTION

Computing and other equipment can be housed in racks along with other computing equipment.

These racks of computer equipment can often be housed in facilities known as computer data centers which house the electronic hardware in rack based cabinets.

Electronic computer system such as servers are also been maintained in a closed rack that requires security. Since the rack is closed and locked, the rack requires cooling. Forced air cooling is often used to cool such a system.

SUMMARY

When such a rack consumes a large amount of power, that rack often requires excess amounts of cooling. However, the inventors found that providing too much cooling can cause an excess amount of condensation. Condensation appears in the form of free water that can be extremely harmful for such cooling equipment.

According to the present application, a cooling system is disclosed where the cooling coil is split into two parts, where the two parts are offset from one another in a way that roughly directs half the cooling air to each of the coils.

It has been found that this can minimize the amount of condensation.

BRIEF DESCRIPTION OF THE DRAWINGS

The drawings show aspects of the invention as described herein, where.

DETAILED DESCRIPTION

The present application describes a special rack based cooling system with a split coil as described herein, where the cooling air is divided between the different coils.

Figure 1:
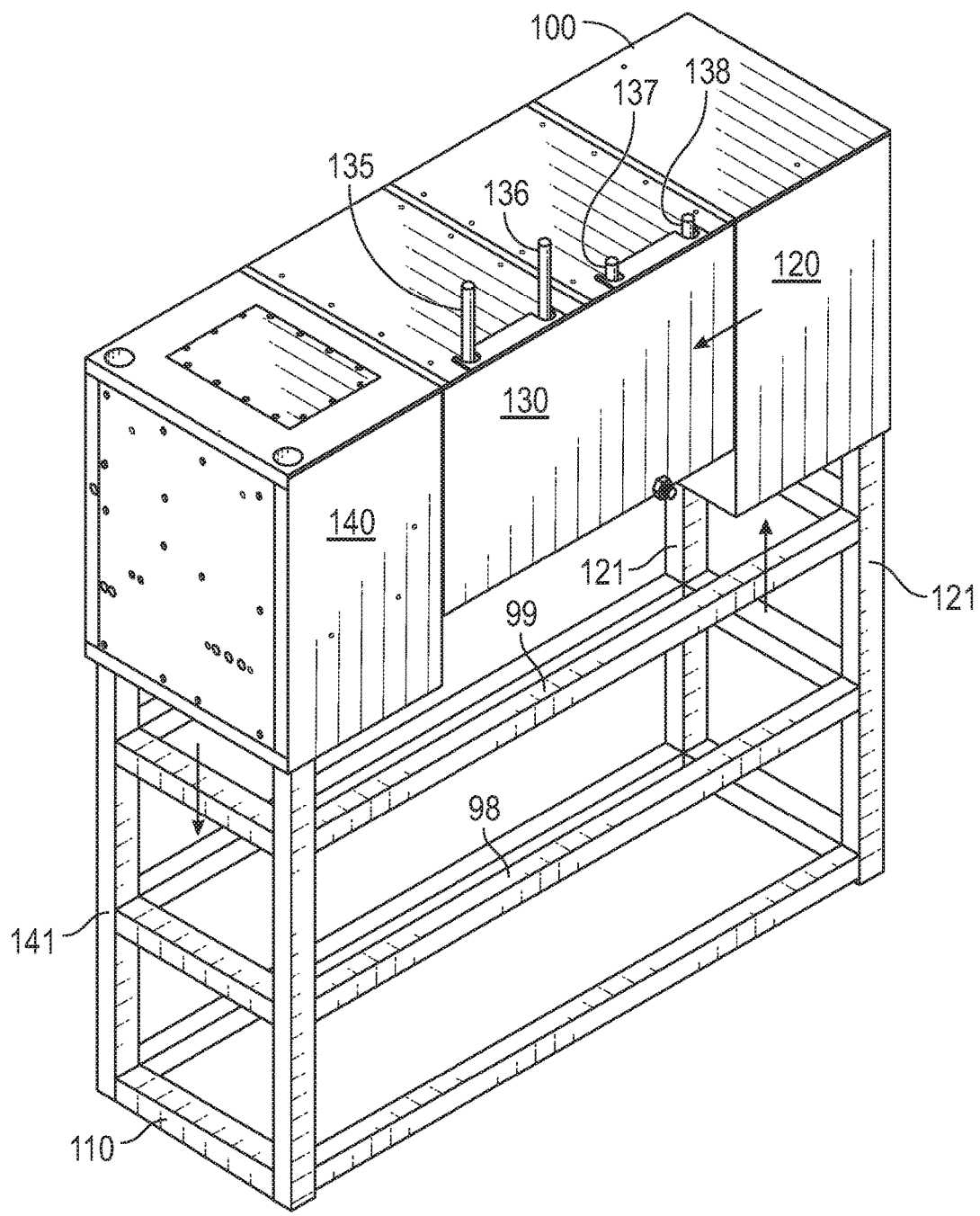
FIG. 1 shows a rack with the cooling equipment.

FIG. 1 shows an embodiment of a cooled system according to the present application. A rack cooler assembly 100 is located over a rack 110. The rack is shown including a number of cooled electronics devices 99 and 98, although any number of cooled devices can be located within the rack 110. The cooled devices can be, for example, computer servers or other cooled devices.

In operation, the cooler assembly 100 receives warm air 121 which has been passed over the electronic devices 98, 99, which are being cooled by the cooling air. The warm air is received into a warm air side 120 of the cooler assembly 100. Air then passes over the split cooler device 130 which is described in more detail herein. The split cooler device receives cooling liquid 135 from the cooled side of a chiller; and returns warmed cooling liquid 136 to the warm liquid side of the chiller. A fan drives the air across the cooler assembly. Air is pulled into the warm air side 120, across the cooler 130 where the air is cooled; into the cooled air side 140, where the cooled air is exhausted downward 141 towards the rack 110, and to cool the computer servers 98 within the rack 110. Further details about the devices are described herein.

Figure 2:
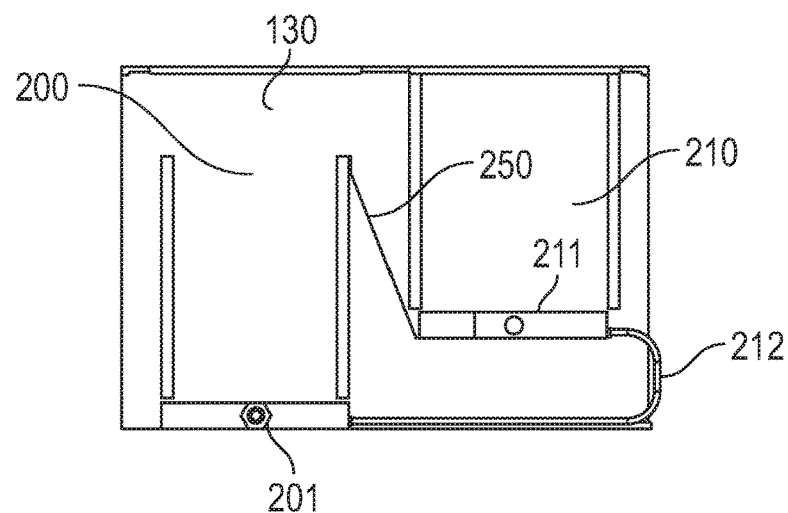
FIG. 2 shows a detailed cutaway view of the cooling system.

FIG. 2 illustrates a more detailed cutaway view of the cooling system 130. There are two coils within the cooling system 130, including a first coil in the area 200 which is located lower down in the airflow path, and a second coil in the area 210 which is higher. Both of the coils are allowed to drain into a condensate area. The coil in area 210 drains into area 211, which is passed by a hose 212 to the draining area 201 which is the drain for the coil in area 200.

Figure 3:
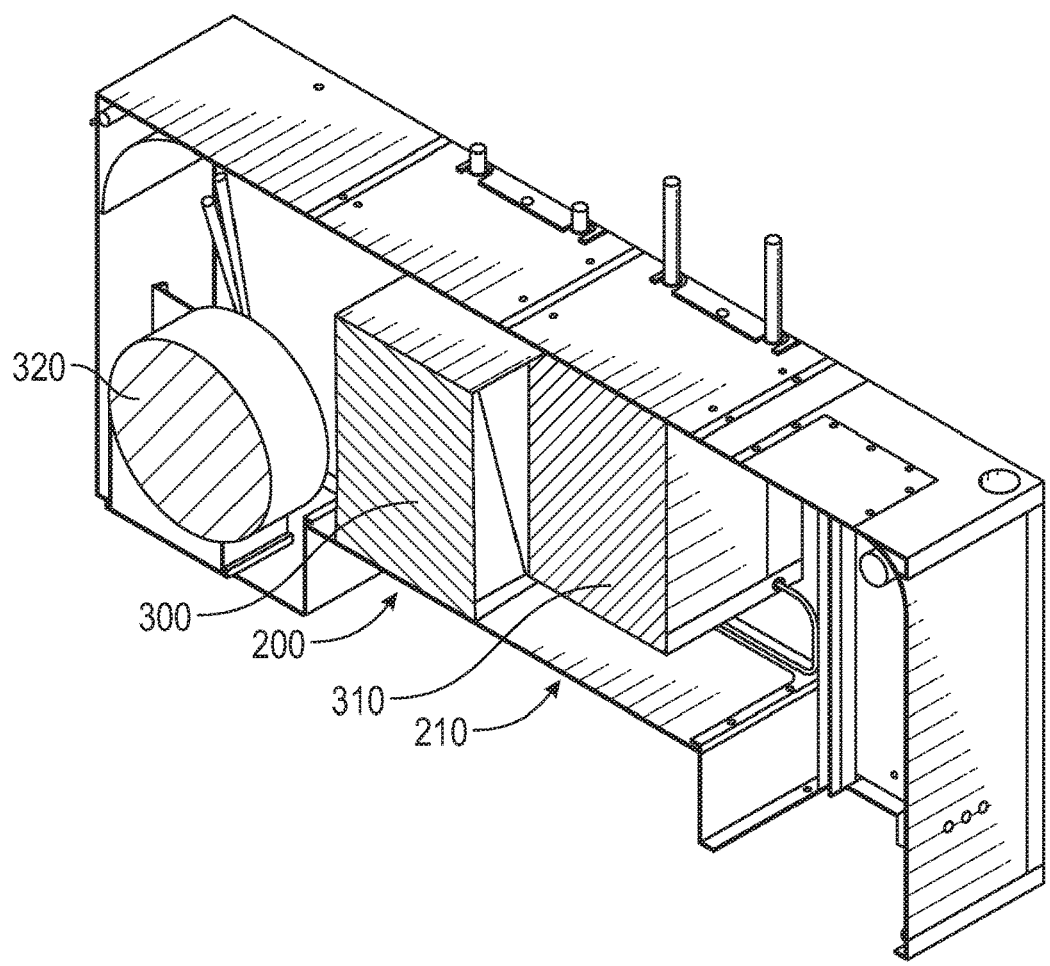
FIG. 3 and FIG. 4 shows a cutaway view of the cooling system from different angles.
Figure 4:
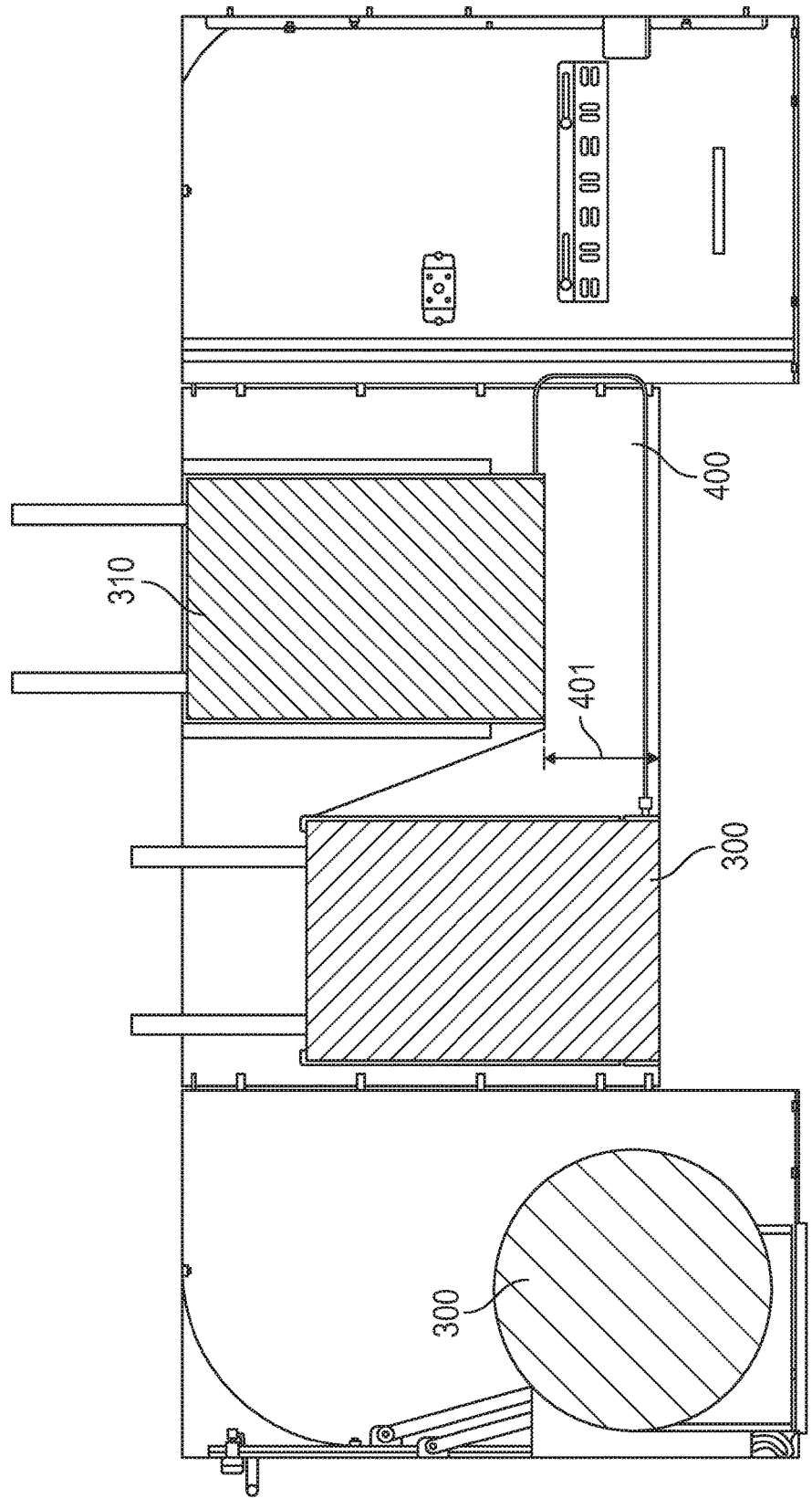

FIG. 3 and FIG. 4 show further detail of the cutaway section of the cooling assembly 100, showing the airflow through that assembly. The assembly generally includes the first cooling coil 300 in the area 200 and the second coil cooling coil 310 in the area 210. The air is passed over the second cooling coil 310 first, which is located higher than the first coil 300. Air is forced in parallel over the 2 coils, by a deflector section 250 between the 2 coils. A fan 320 forces the air down to the cooled side 140 of the rack 110.

The same parts are generally shown in FIG. 4, which shows a side on cross section illustrating the two coils. Air reaches the first coil 310 first, and a restricted opening area of 400, of size 401 where the size 401 is roughly ⅓ to ⅙ of the length of the coil 310 over which the air is passed, is left for the air to pass without passing over the coil 310. The air that passes through that restricted opening 401 is delivered to the second coil 300 to be cooled thereby.

Figure 5:
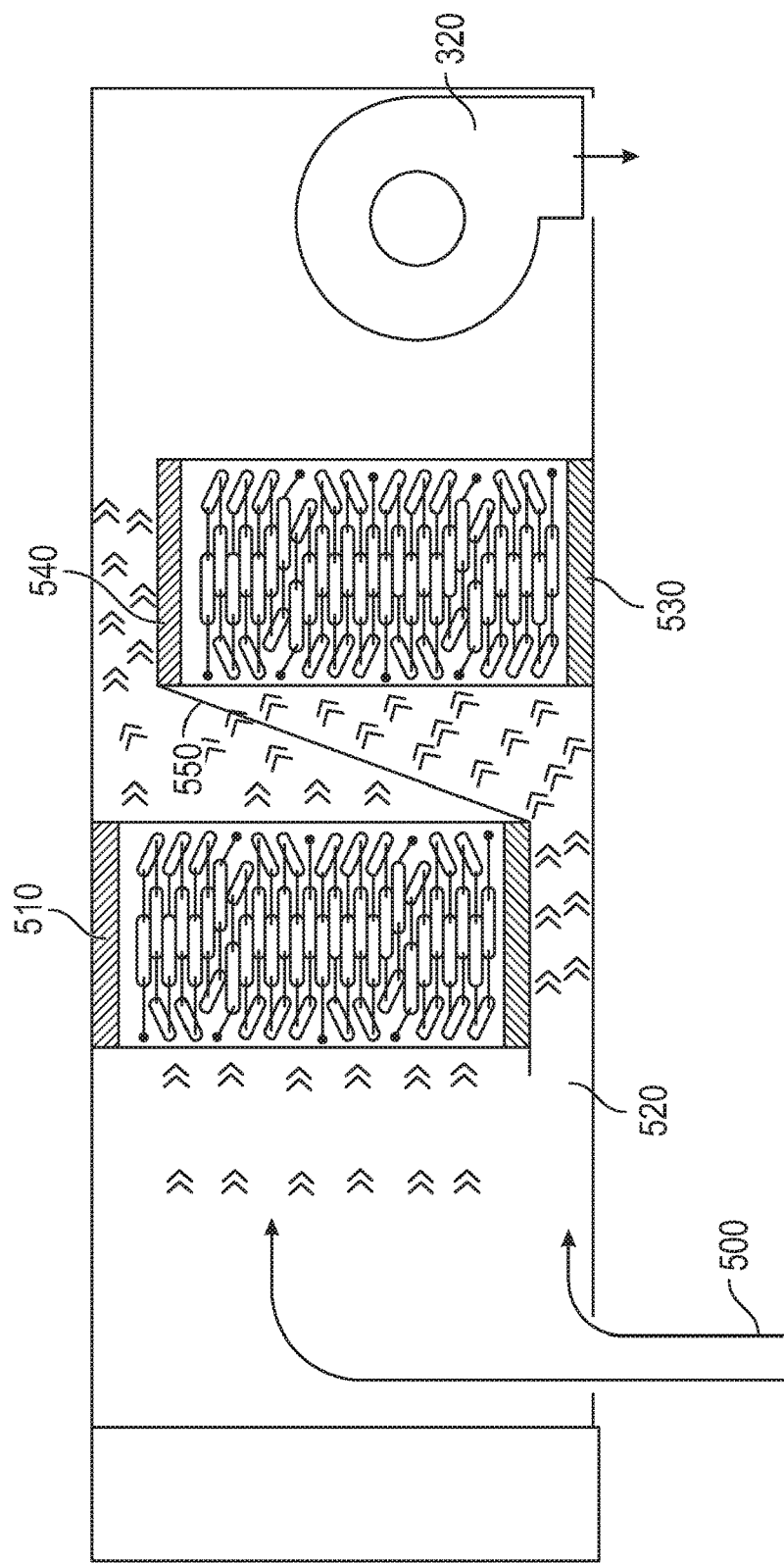
FIG. 5 illustrates the airflow operation, showing the specific parameters and sizes of the different coils.

FIG. 5 illustrates the airflow operation, showing the specific parameters and sizes of the different devices. The airflow 500 is shown in FIG. 5, being sucked into the cooling area by the fan 320. In this embodiment, the coil has a length from top to bottom of 23.75 inches, and there is an opening 520 of 3.5 inches under the coil where air can pass around the coil 510 to the second coil 520 530.

The second coil 530 is again 23.75 inches. Both of the coils are 12 inches in length, along which length the air flows.

The cooled air that passes through the first coil 510 is later constricted to a 3.5 inch area at 540, so that the total air resistance across the two parallel coils is roughly the same.

An air deflector 550 between the 2 coils is also shown. In this way, air is brought in parallel over the 2 split and staggered coils including the coil 510 located at the top of the air chamber, with air passing through the area 520 around the first coil 510. That same air passes over the second coil 530, and at the same time the air that is passed through the coil 510 is passed through the constriction 540 to equalize the flow resistance through the two coil parts.

Both of the coils thus provide a substantially equal air resistance amount but in parallel cooling paths.

Figure 6A:
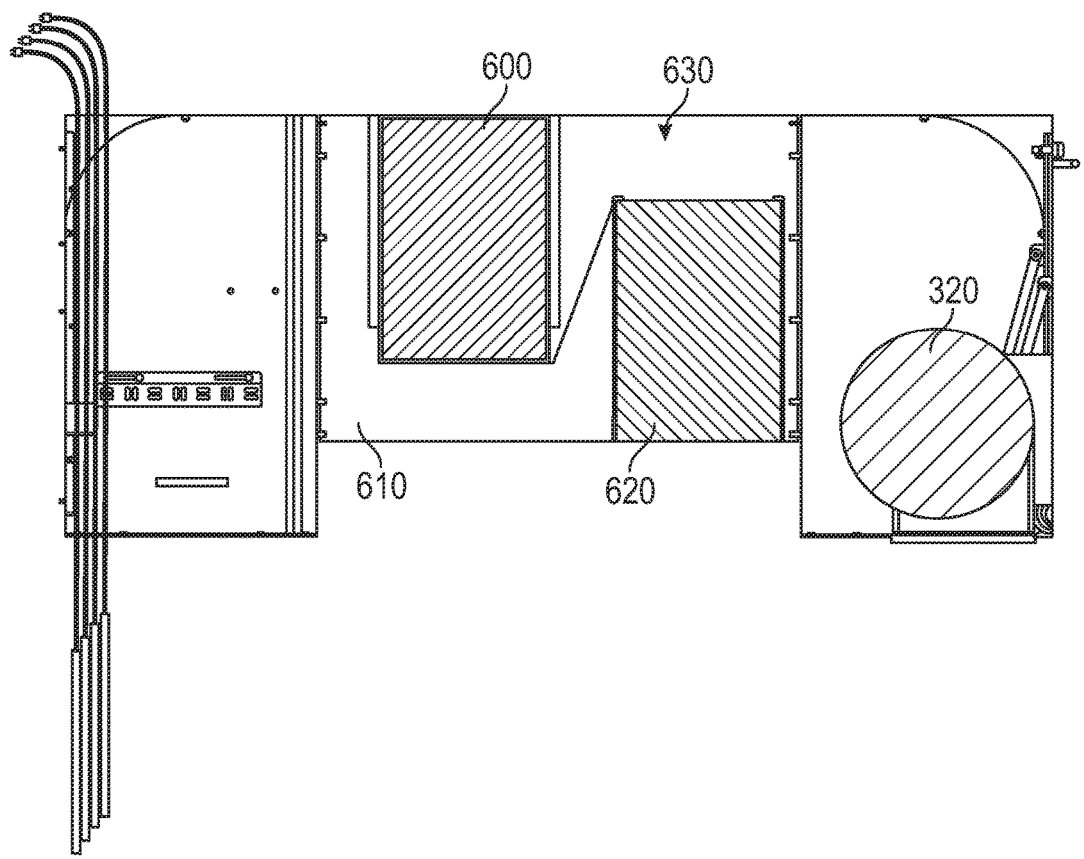
FIG. 6A shows different coil sizes.
Figure 6B:
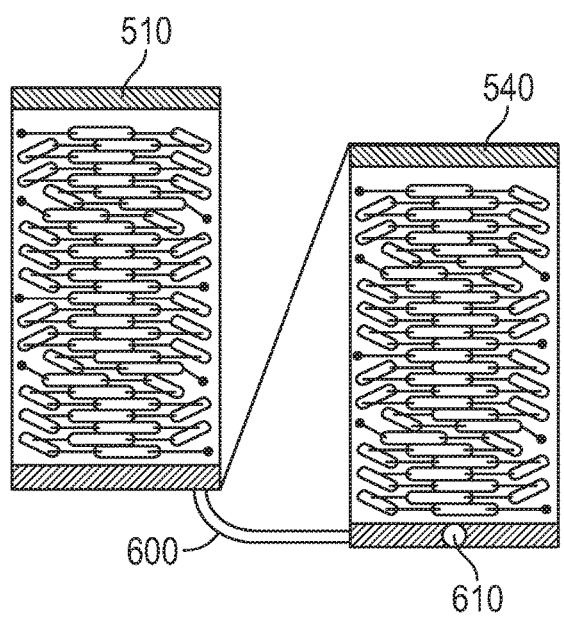
FIG. 6B shows the connection between the coils.

An alternative embodiment in FIG. 6A shows the coils being 17.75 inches and the restriction being 6 inches. In this embodiment, there is a coil 600 with a six-inch constriction 610. The second coil 620 has a 6.156 inch constriction 630. This provides a little less air resistance on the first coil than the second coil, to compensate for the second coil being closer to the fan 320. FIG. 6B illustrates how the condensate from the first coil 510 drains via a drain line 600 to a condensation area under the second coil 540, which includes a condensation drain 610.

Figure 7:
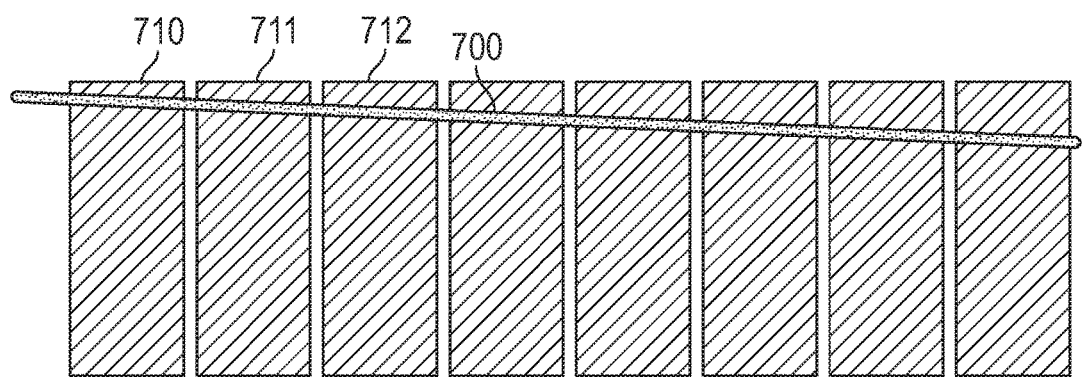
FIG. 7 shows the condensation lines across the different racks.

The condensation of a number of rows of racks is tied together as shown in FIG. 7 which shows the condensation line 700 from a number of different racks 710 711 712 etc. In this embodiment, there is an average drop of a quarter inch per foot which enables 15 different racks to be connected to the same condensation line.

Although only a few embodiments have been disclosed in detail above, other embodiments are possible and the inventors intend these to be encompassed within this specification.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A cooling system, comprising:
   a cooling chamber, defining a path for airflow, said cooling chamber having side surfaces through which cooling air is passed from a warm air side to a cold air side;
   a first cooling coil, located in the cooling chamber, blocking a first side of the cooling chamber, and allowing air to pass around the first cooling coil on the second side of the cooling coil, said first cooling coil receiving cooling fluid and cooling the air that passes through the first cooling coil, while the air that passes around the first cooling coil not being cooled by the first cooling coil; and
   a second cooling coil, also located in the cooling chamber, blocking the second side of the cooling chamber and receiving air which has passed around the first cooling coil into the second cooling coil to cool the air that passes around the first cooling coil.

2. The cooling system as in claim 1, further comprising a deflector, which forces all of the air which passes around the first cooling coil to pass across the second cooling coil.

3. The cooling system as in claim 2, wherein air that passes across the first cooling coil and the second cooling coil are exhausted in parallel at the cooled air side as cooled air.

4. The cooling system as in claim 3, further comprising a circulating fan which circulates the air which has passed across the first cooling coil and the second cooling coil.

5. The cooling system as in claim 3, further comprising an equipment rack, that is cooled by air passing across the first cooling coil and the second cooling coil, where the equipment rack includes rack sections holding heat producing elements, which receive cooled air on a first side of the heat producing elements, that passes across the heat producing elements, to produce warmed air on a second side of the heat producing elements, and wherein the warmed air is received by the warm air side of the cooling chamber.

6. The cooling system as in claim 2, wherein an area on an output of the first cooling coil is restricted by the deflector.

7. The cooling system as in claim 6, wherein the area of the air restricted by the deflector is the same as the area of the air that passes around the first cooling coil.

8. The cooling system as in claim 1, wherein the first cooling coil is located on a top portion of the cooling chamber and the second cooling coil is located on the bottom portion of the cooling chamber.

9. The cooling system as in claim 1, wherein the air that passes around the cooling coil is restricted to about ⅙ of the air area that passes over the cooling coil, and the air restriction at the output of the first cooling coil is the same restriction.

10. A cooled equipment rack, that is cooled by air passing across a first cooling coil and second cooling coil, where the equipment rack includes rack sections holding heat producing elements, which receive cooled air on a first side of the heat producing elements, that passes across the heat producing elements, to produce warmed air on a second side of the heat producing elements, and wherein the warmed air is received by a warm air side of the cooling chamber, which cools the warm air to produce cooled air,
   where the first cooling coil and the second cooling coils are split and staggered coils including the first coil blocking a first part of the air flow passage and allowing air to pass around the first cooling coil, and the second cooling coil that receives the air that passes around the first cooling coil, which is downstream of the first cooling coil and wherein there is a constriction at an output of the first cooling coil to equalize air flow resistance through the first cooling coil and the second cooling coil.

11. The rack as in claim 10, wherein an output of air from the first cooling coil is constricted to a same volume as the air to the second cooling coil.

* * * * *